US007030637B2

(12) United States Patent
Berthold et al.

(10) Patent No.: US 7,030,637 B2
(45) Date of Patent: Apr. 18, 2006

(54) SEMICONDUCTOR DEVICE FOR ADJUSTING THRESHOLD VALUE SHIFT DUE TO SHORT CHANNEL EFFECT

(75) Inventors: Jorg Berthold, Munich (DE); Rafael Nadal Guardia, Munich (DE)

(73) Assignee: Infineon Technologies AG, Munich (DE)

( * ) Notice: Subject to any disclaimer, the term of this patent is extended or adjusted under 35 U.S.C. 154(b) by 59 days.

(21) Appl. No.: 10/640,417

(22) Filed: Aug. 13, 2003

(65) Prior Publication Data

US 2004/0113649 A1 Jun. 17, 2004

(30) Foreign Application Priority Data

Aug. 30, 2002 (DE) ................................ 102 40 177
Dec. 18, 2002 (EP) ................................ 02028136

(51) Int. Cl.
*G01R 31/26* (2006.01)

(52) U.S. Cl. .................... 324/763; 324/765; 324/158.1

(58) Field of Classification Search ............... 324/73.1, 324/158.1, 763, 765–769; 714/724–733; 327/52

See application file for complete search history.

(56) References Cited

U.S. PATENT DOCUMENTS

| | | | |
|---|---|---|---|
| 4,346,344 A | 8/1982 | Blauschild | |
| 4,789,825 A * | 12/1988 | Carelli et al. | 324/765 |
| 5,565,799 A * | 10/1996 | Houston | 327/52 |
| 6,091,283 A | 7/2000 | Murgula et al. | |

* cited by examiner

*Primary Examiner*—Vinh P. Nguyen

(74) *Attorney, Agent, or Firm*—Fish & Richardson P.C.

(57) ABSTRACT

A semiconductor device detects and adjusts leakage current dependent on threshold voltage of an integrated semiconductor device. To adjust the threshold voltage variation due to uncertainties in the channel length induced by the fabrication process (short channel effect) in the semiconductor a comparison between small and long channel devices is proposed. According to the comparison result, a bias potential is provided to the semiconductor device to adjust the threshold voltage.

18 Claims, 13 Drawing Sheets

SEMICONDUCTOR DEVICE FOR ADJUSTING THRESHOLD VALUE SHIFT DUE TO SHORT CHANNEL EFFECT

RELATED APPLICATIONS

This application claims priority from German Application Serial No. 102 401 77.2, filed Aug. 30, 2002, and from European Patent Application No. 02 028 136.6 filed Dec. 18, 2002, the contents of which are incorporated herein by reference.

TECHNICAL FIELD

The present invention generally relates to a semiconductor device, and more specifically, to a semiconductor device for detecting and adjusting leakage current.

BACKGROUND

Recent measurements taken on NMOS and PMOS transistors implemented in sub-micron technologies have shown a great dependence of the threshold voltage values of the transistors on the channel length. Transistors realised in sub-micron technology provide a channel length below 1 μm. FIG. 1 shows a cross-section of a state of the art NMOS transistor in sub-micron technology on a bulk or wafer (6). The distance between n-doped-source (1) and -drain (2) under gate (3) in a p-doped-well 5 is referred to as the channel length (4). A small channel length variation which may be caused by tolerances in the fabrication process, can shift the threshold voltage value around 80 mV. FIG. 2 shows the qualitative evolution of the threshold voltage value versus the channel length L in logarithmic scale. When minimum length transistors with low threshold voltage values ($V_t$) are implemented (with $V_t$ in the range from 0 mV to 400 mV), a small variation of the channel length has great impact on the threshold voltage value (see FIG. 2). This effect is referred to as Short Channel Effect. Therefore, the shift due to the uncertainty introduced in the channel length has a great impact in the performance of the device. Moreover, the impact on the performance of the circuits provided with these transistors is also highly affected in terms of static and dynamic terms. For digital circuits, static and dynamic power consumption increases and the performance in terms of speed is also affected. With regard to these problems, it is necessary to implement any kind of strategy capable to determine whether the length of minimum length devices (NMOS and PMOS transistors) is shifted and therefore causes a change in the threshold voltage value $V_t$.

Besides of the shifting in $V_t$ due to variations in the channel length L, $V_t$ can also change by reason of the doping dose used to implant the channel or a change in the thickness of the gate oxide. These two technology parameters, the doping dose and thickness of the oxide, will determine the status of the transistors. Three different status are allocated, "fast", "nominal" and "slow" corresponding to small, nominal and high value of $V_t$, respectively. Short channel effects can appear in any one of these status of the technology.

Several strategies have been reported to establish a certain well potential bias in digital circuits when this bias is necessary. Well known strategies are based on delay lines and off current detection. Delay lines are formed by several transistors in series. Therefore, a change of the $V_t$ value of the transistors changes the introduced delay. In dependence of the introduced delay the well potential bias is applied. The strategy based on delay lines can also be realised using critical path replicas. U.S. Pat. No. 6,091,283 describes a sub-threshold leakage tuning circuit which aims to compensate for process, activity and temperature-induced device threshold variations in a semiconductor circuit having a transistor, a potential of the gate wherein the transistor is held to a preset subthreshold potential and a channel current of the channel region is compared with a reference current to obtain a comparison result. A bias potential of a substrate is adjusted according to the comparison result to hold the subthreshold current at the reference current. The reference current is provided by a separate reference source. The device under test (DUT) is configured in a circuit in which the current is compared with said isolated reference current. The proposed method does only provide a solution for compensation for changes in device characteristics across process and temperature.

Another well known strategy is based on detection of the off current. However, some of these strategies require the use of band gap references to allow proper operation for a large range of temperatures. Moreover, none of these strategies allow to compare the performance of a DUT with the performance of a long channel device operating as a reference without requiring any additional temperature reference circuit.

SUMMARY

It is thus an object of the invention to provide a semiconductor device and a method capable to detect the change of $V_t$ due to the short channel effects but not the change due to the status of the technology whereby not requiring any additional temperature reference circuit. It is further an object of the invention to provide a semiconductor device and a method to adjust the $V_t$ value by means of well potential control.

The object of the invention is solved by a semiconductor device that comprises a test circuit containing at least one transistor as a device under test (DUT) having a drain, a source, a gate and a channel region under the gate between the drain and the source with a short channel length, a reference circuit containing at least one transistor as a reference device having a drain, a source, a gate and a channel region under the gate between the drain and the source with a long channel length, a comparator circuit comparing the output of the test circuit with the output of the reference circuit and providing a comparison result and a bias circuit providing a bias potential to the well of the test circuit when the output of the test circuit is smaller than output of the reference circuit.

The new method is based on the use of a DUT or a group of parallel DUTs, implemented with minimum length, which are compared with a reference device, or a group of reference devices, designed with long channel length. It is understood that said bias circuit can be implemented on the same bulk or substrate as the test and reference circuit but may also be an external circuit. In front of many other reported solutions, according to the inventive semiconductor device the control of the well potential is established by means of comparison of a device under test (DUT) with adjustable well potential and a long channel devise as a reference device (Reference) with a fixed well potential. Providing an appropriate potential to the well of the DUT leads to an increase of the absolute value of the threshold voltage and a decrease of the leakage current of the DUT. The well potential can be set to a fixed value referring to a minimum of the leakage current or adjusted in steps. When a reference circuit with one or more transistors with long channels is used to provide the reference in the semiconductor device according to the invention, the output of the reference circuit is smaller than that of the test circuit whenever the DUT is not affected by the Short Channel Effect. Thus, the shift of the threshold voltage due to the Short Channel Effect is detected and adjusted but not the variations due to changes in temperature or process. This achievement is enhanced by implementation of the test and the reference circuit on the same die of the semiconductor device and so that they are subject to the same temperature and process variations. By using a set of devices, i.e. transistors, both in the reference circuit and the test circuit a shift due to statistical variations of the threshold voltage is avoided. In other words, in the proposed invention, temperature variations are affecting to the output voltage of both circuits in a similar way. Therefore, it is not necessary to provide any kind of temperature compensation for a large range of operating temperatures.

Advantageously, a proper circuit design in the proposed invention allows only detection of the variation of $V_t$ due to short channel effects. The short channel effects due to variations during the fabrication process will be common for all the implemented transistors in a wafer. However variations in the doping profile or the thickness of the gate oxide layer are also taken into account in the proposed invention. In order to minimise the impact of the statistic variation of the $V_t$ of the DUTs and the reference device, several devices in parallel can be implemented.

The semiconductor device of the proposed invention can be applied to sense the off-current or the current in saturation of the DUT and the reference device. The method is not limited to cut-off operation of the devices. Moreover, the proposed compensation of the threshold voltage variation (due to uncertainties in the channel length introduced during the fabrication process) can be based on voltage monitoring or current detection. The possible strategies can be summarised as follows:

In a current mode the comparator circuit is addressed to achieve a fixed ratio between the current of the DUT and the reference circuit. In this mode, said comparator circuit compares the drain current of the test circuit with the drain current of the reference circuit and provides a comparison result and said bias circuit provides a bias potential to the well of the test circuit when the drain current of the test circuit is smaller than the drain current of the reference circuit.

In a voltage mode the output voltage of the DUT and the Reference circuit are monitored. In this mode, a first sensing element is connected to the drain of the DUT providing a test circuit output voltage according to the drain current of the test circuit. A second sensing element is connected to the drain of the reference device providing a reference circuit output voltage according to the drain current of the reference circuit. Said comparator circuit compares the output voltage of the test circuit with the output voltage of the reference circuit and said bias circuit provides a bias potential to the well of the test circuit when the output voltage of the test circuit is smaller than the output voltage of the reference circuit. In both modes the DUT and the Reference device can either work in saturation region or in cut-off region.

Furthermore, the method can be easily applied to control current consumption during the dynamic or the static operation of digital circuits. The control of the well potential of the DUT taking the output of the reference circuit as reference value in the comparator allows the adjustment of the current flowing through a sensing element. Therefore the applied value in the well of the DUT can be also applied to the digital circuits implemented in the same die.

Without limiting the scope of protection a preferred embodiment of the general invention is explained with reference to the accompanying drawings, which show in

DETAILED DESCRIPTION

Figure 1:
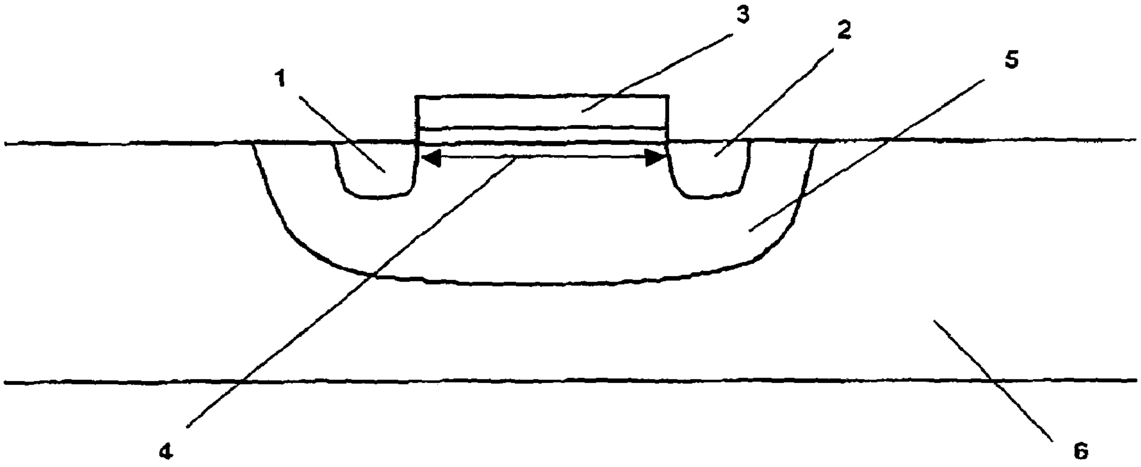
FIG. 1: a cross-section of an NMOS transistor from the state of the art.
Figure 2:
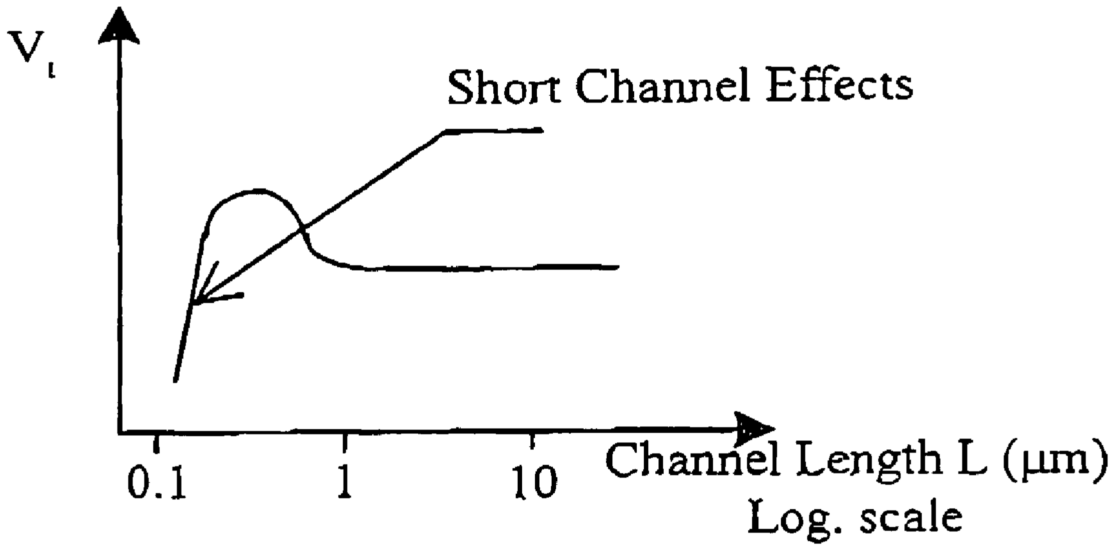
FIG. 2: a diagram of the qualitative evolution of the threshold voltage value versus the channel length.
Figure 3:
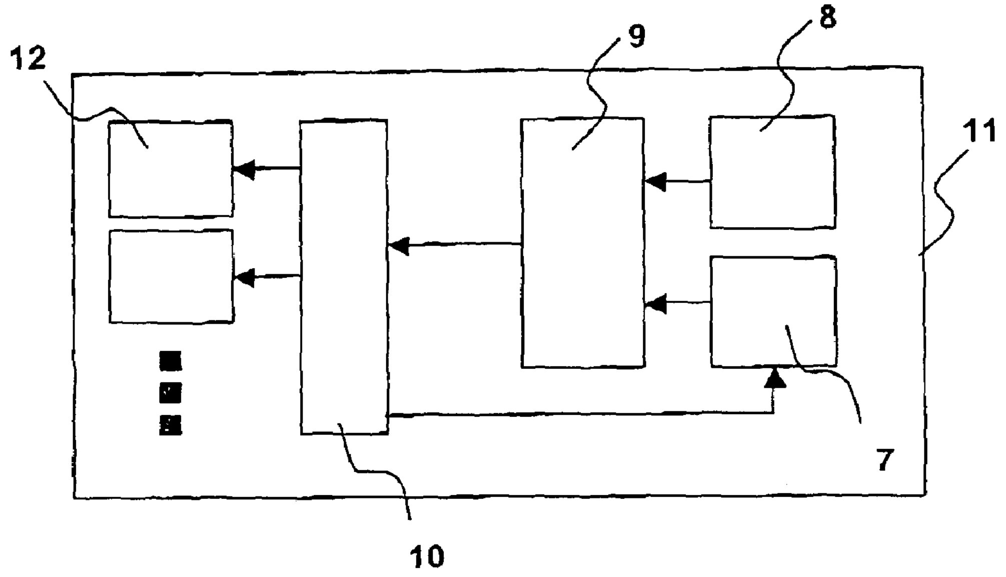
FIG. 3: a block diagram of the semiconductor device according to the invention.

As shown in FIG. 3 there are three constitutive circuit blocks that are required for detecting the $V_t$ value variations. A first circuit block 7 with a device under test (DUT), a second circuit block 8 with a reference device and a third circuit block 9 with a comparator for comparing the outputs of the test circuit and the reference circuit.

The output of the comparator circuit 9 is in a first embodiment a digital signal i. e. a binary signal and in a preferred second embodiment an analogue signal. Digital closed loop control circuits for the well potential require in this second embodiment an analogue digital conversion of the analogue comparator output signal.

Figure 4:
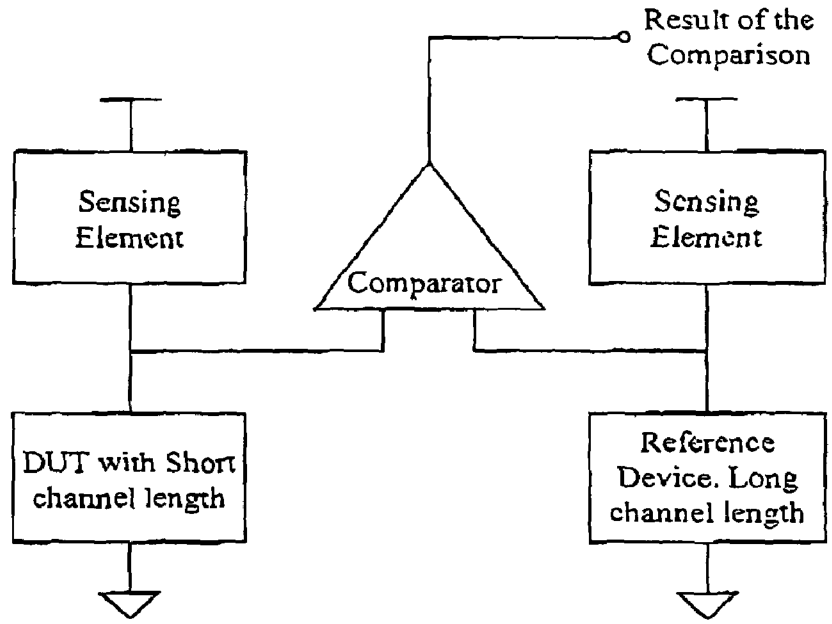
FIG. 4: a block diagram of the proposed detection method for threshold voltage variations due to short channel effects whereby the configuration is based on NMOS DUTs and NMOS reference devices.
Figure 5:
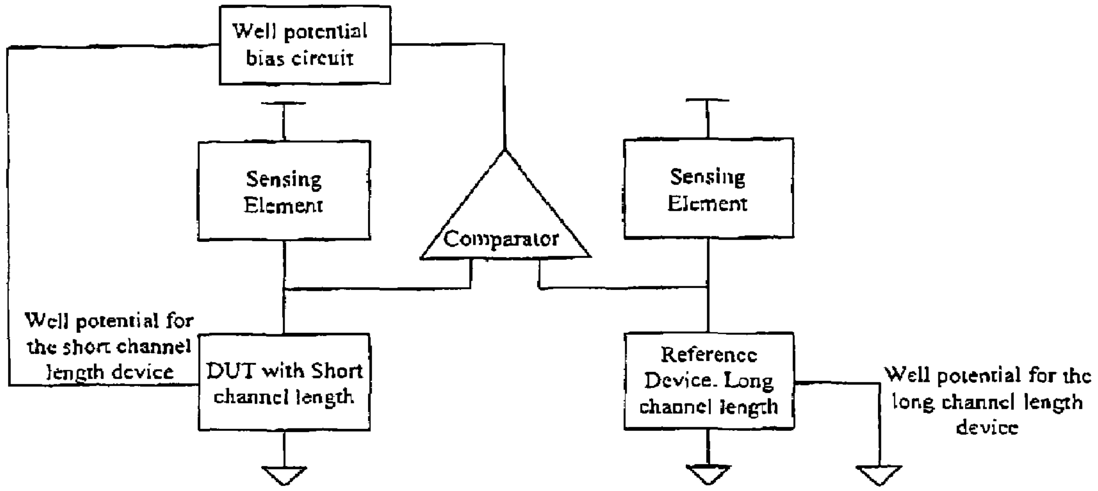
FIG. 5: a block diagram of the proposed leakage current control method whereby the configuration is based on NMOS DUTs and NMOS reference devices.

In order to control the current consumption of the circuit a change in the $V_t$ value has to be detected and adjusted by a system capable to adjust the well potential to the desired value as shown in FIGS. 4 and 5. The well potential can be applied by a charge pump in a well potential bias circuit 10, for instance. The test circuit contains the DUT and the reference circuit contains the reference devices on a wafer 11.

As shown in FIGS. 4 and 5 both circuit blocks comprise a sensing element. The sensing element is a device providing a voltage drop caused by the current flowing through it. The current depends on the $V_t$ of the DUT in the test circuit or the reference devices in the reference circuit. The sensing element is connected between $V_{DD}$ and the drain of the DUT in the case of an NMOS DUT. A similar configuration is implemented for the reference circuit. In the case of PMOS DUT, the sensing element is connected between VSS and the drain of the PMOS devices. The output voltage is taken in the drain of the DUTs and the drain of the reference devices. The sensing element can be implemented with a resistor or a long channel transistor.

Adjustment of the threshold voltage is carried out comparing the output voltage of the test circuit 7 and the reference circuit 8. When the output voltage of the test circuit 7 is higher than the output voltage of the reference circuit 8 the well potential of the DUT is not adjusted. When the output voltage of the test circuit 7 is smaller, the well potential is decreased for the NMOS DUTs and increased for the PMOS DUTs. The well potential is changed up to the point in which the output of the test circuit 7 is equal to the output of the reference circuit 8. The output of the reference circuit 8 is maintained constant because the well potential of the reference devices is not changed. It is important to notice that only in the case of having short channel effects in the DUT, the output voltage in the test circuit 7 is smaller than the output voltage in the reference circuit 8.

When this online detection of the $V_t$ variation is implemented in a die 11 with other digital circuits 12, the adjustment of the well potential can be carried out for all the devices in all the circuits. In such a way, current consumption in dynamic operation would be reduced without penalty on the designed performance of the circuits. The performance is not degraded because the circuits are designed to work with a value of the $V_t$ without short channel effect, thus, when the shift due to short channel is detected the $V_t$ is adjusted to the right value, and the performance is adjusted to the designed one.

Following, two different examples are explained; one of them in which the gate of the DUT and the reference device are tied to ground so that the devices operate in cut-off region. The second one, the gate of the devices is fixed to a certain value allowing saturation operation of the transistors.

Figure 6A:
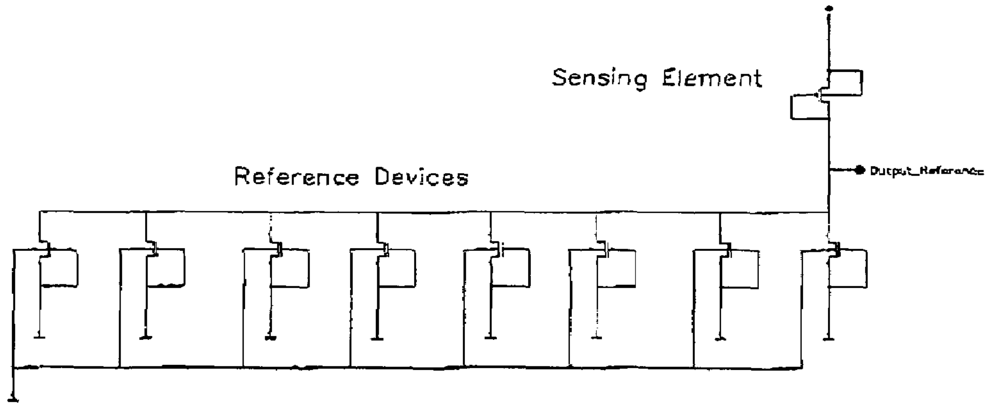
FIG. 6*a*: a circuit configuration for the detection of $V_t$ variations in NMOS transistors of a reference circuit.
Figure 6B:
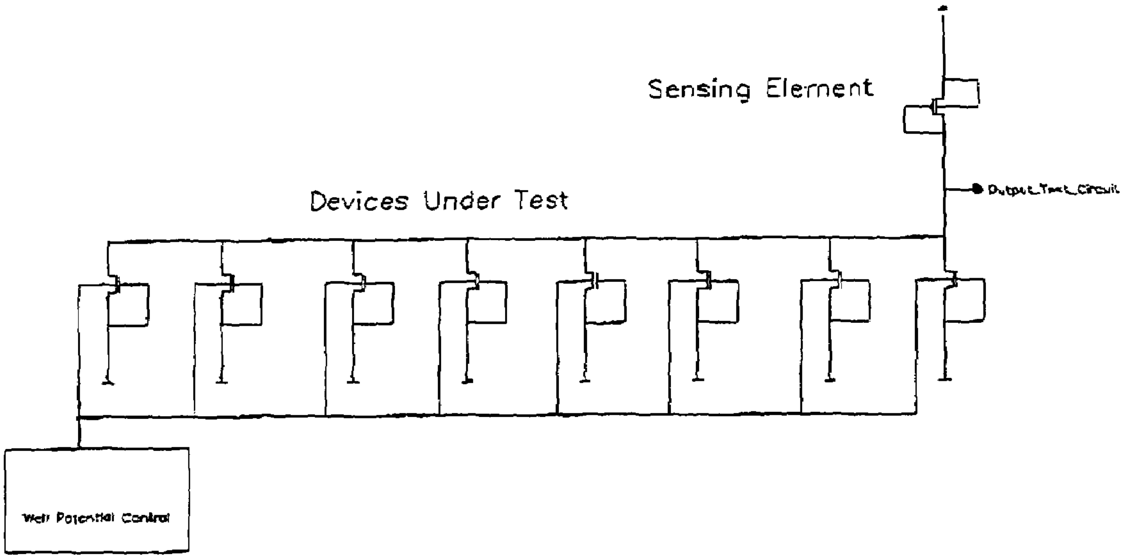
FIG. 6*b*: a circuit configuration for the detection of $V_t$ variations in NMOS transistors of a circuit under test.

As depicted in FIG. 6*a* and FIG. 6*b* the reference device and the device under test are a set of devices in order to avoid the shifting due to statistical variations of $V_t$. With this configuration the output voltage is only affected by variations due to the length of the transistors. A PMOS transistor with the gate connected to its drain is used as sensing element. In the proposed semiconductor device the detection of the $V_t$ shift is carried out for "fast", "slow", and "nominal" transistors. That is, the method is capable to determine when the shift in the $V_t$ value is due to short channel effects or only to a change in the status of the devices (that is "fast", "slow" or "nom."). The semiconductor device according to the present invention will compensate the case in which the shift in $V_t$ is only due to the short channel effect.

Figure 7:
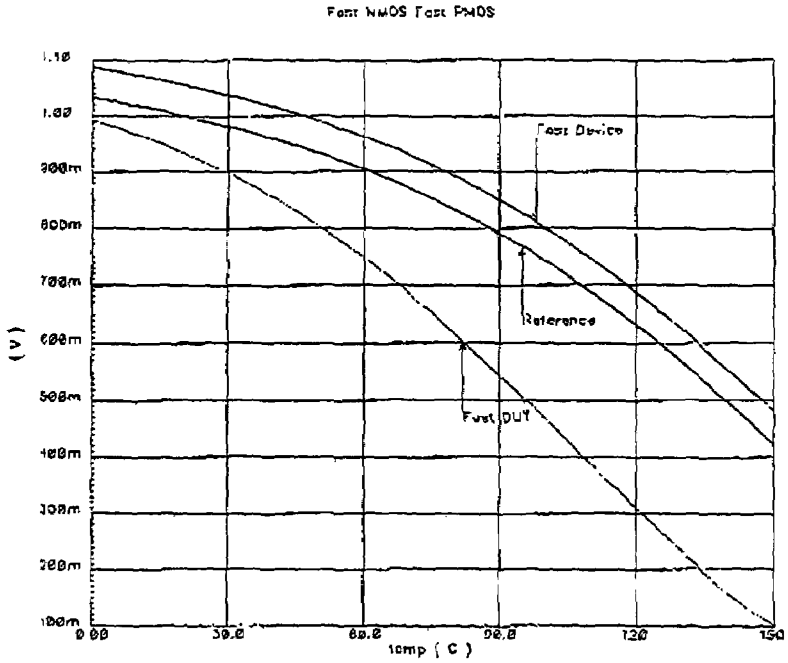
FIG. 7: a diagram of the detection of "fast" DUTs with short channel effects in front of "fast" devices without short channel effects (case "fast" PMOS)
Figure 8:
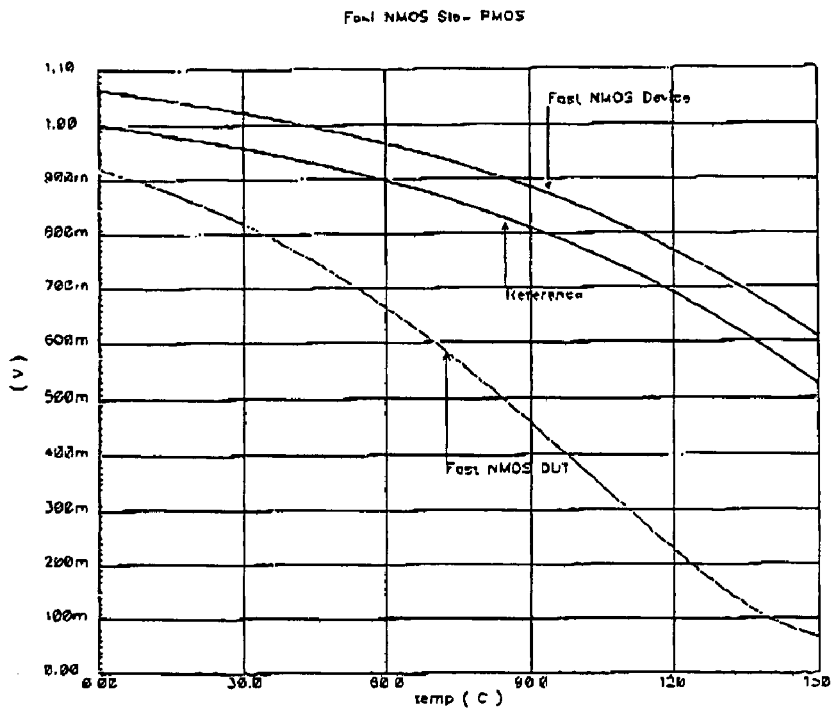
FIG. 8: a diagram of the detection of "fast" DUTs with short channel effects in front of "fast" devices without short channel effects (case "slow" PMOS)
Figure 9:
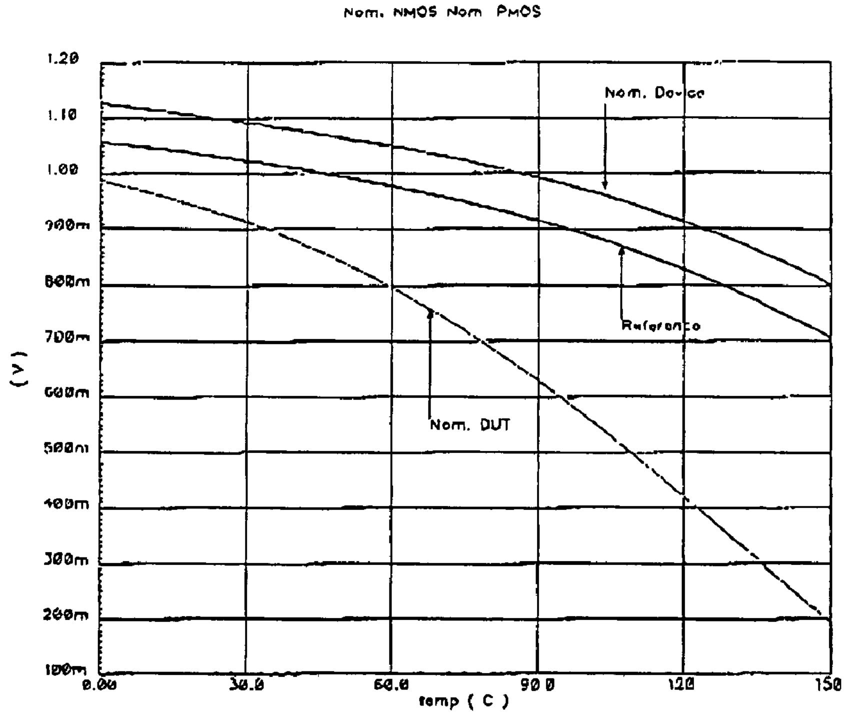
FIG. 9: a diagram of the detection of "nom." DUTs with short channel effects in front of "nom." devices without short channel effects
Figure 10:
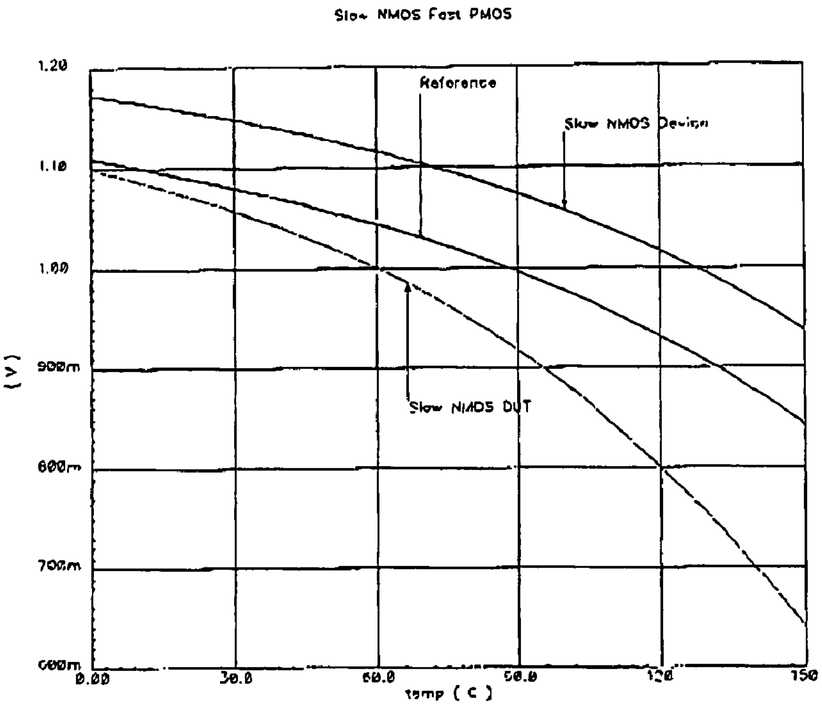
FIG. 10: a diagram of the detection of "slow" DUTs with short channel effects in front of "slow" devices without short channel effects (case "fast" PMOS)
Figure 11:
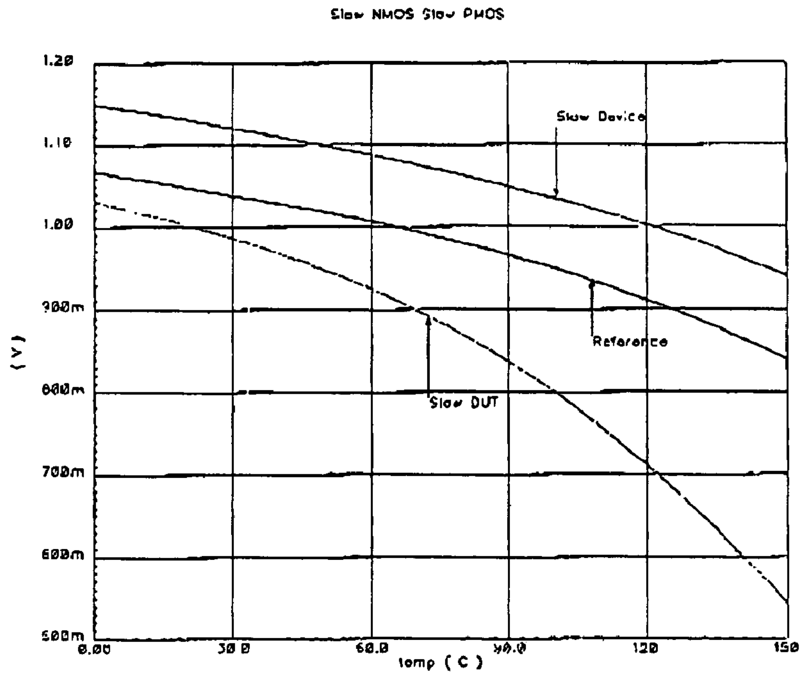
FIG. 11: a diagram of the detection of "slow" DUTs with short channel effects in front of "slow" devices without short channel effects.

In this scenario simulations show how the short channel effects are detected from every status of operation (that is, "fast", "nom." or "slow" conditions) and for a large range of temperatures (0, 150° C.). The simulations have been carried out in order to show that the output voltage of the reference circuit will be always smaller than the output voltage of the circuit under test when the DUTs are not affected by the short channel effect ("Fast Device" line for FIG. 7, "Fast NMOS Device" line in FIG. 8, "Nom. Device" line in FIG. 9, "Slow NMOS Device" line in FIG. 10, and "Slow Device" in FIG. 11). However as depicted in the same figures (from FIG. 7 to FIG. 11) the output of the reference circuit is always greater than that of the DUT affected by the short channel effects ("Fast DUT" line for FIG. 7, "Fast NMOS DUT" line in FIG. 8, "Nom. DUT" line in FIG. 9, "Slow NMOS DUT" line in FIG. 10, and "Slow DUT" in FIG. 11).

Figure 12:
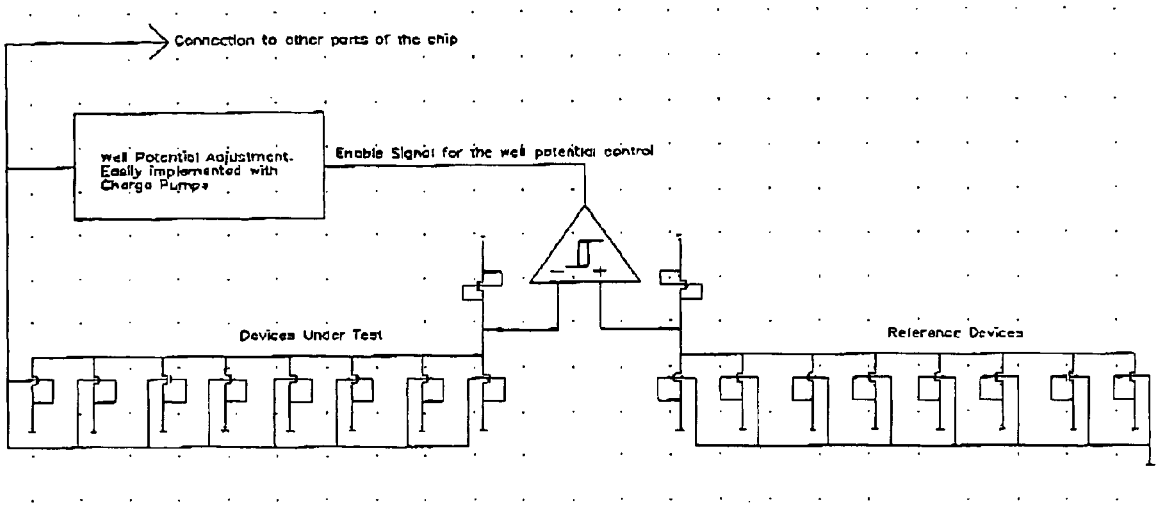
FIG. 12: a circuit configuration for the control of the leakage current based on the proposed method for detection of $V_t$ variation.

In the proposed semiconductor device the current consumption control would be carried out as depicted in FIG. 12. The comparator would switch on or switch off the well potential bias block. The adjustment of the well potential can be easily implemented with charge pump circuits.

Figure 13:
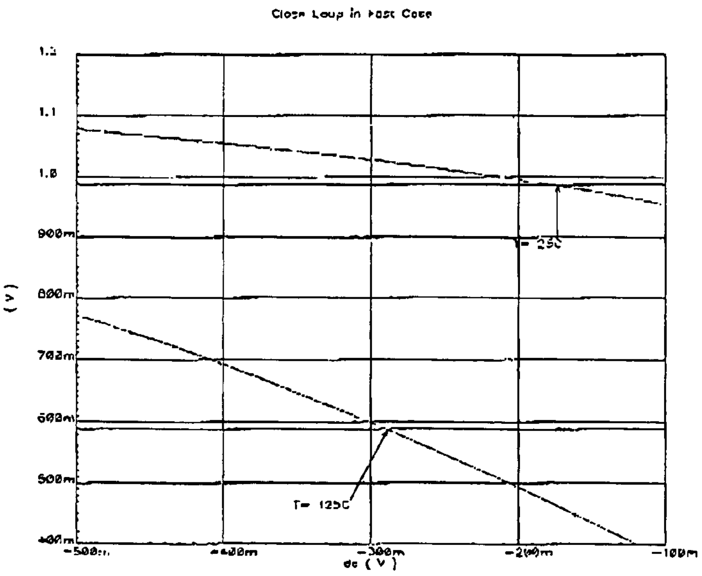
FIG. 13: a diagram of the output voltage evolution when back bias is applied to the p-well of the NMOS DUTs of the test circuit and the reference devices are tied to ground (case T=25° C. and 125° C., and "fast" transistors)
Figure 14:
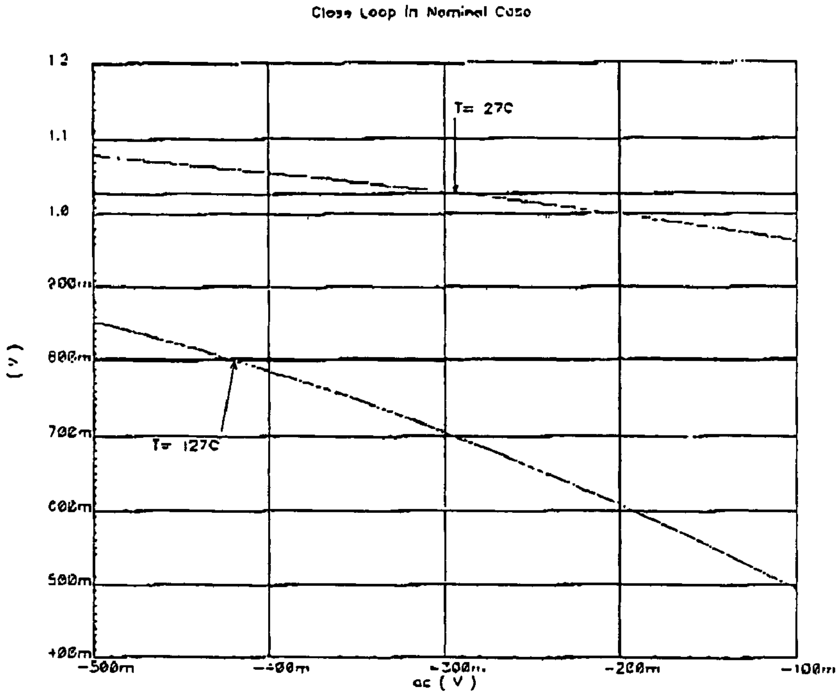
FIG. 14: a diagram of the output voltage evolution when back bias is applied to the p-well of the NMOS DUTs of the test circuit and the reference devices are tied to ground (case T=25° C. and 125° C., and "nom." transistors)
Figure 15:
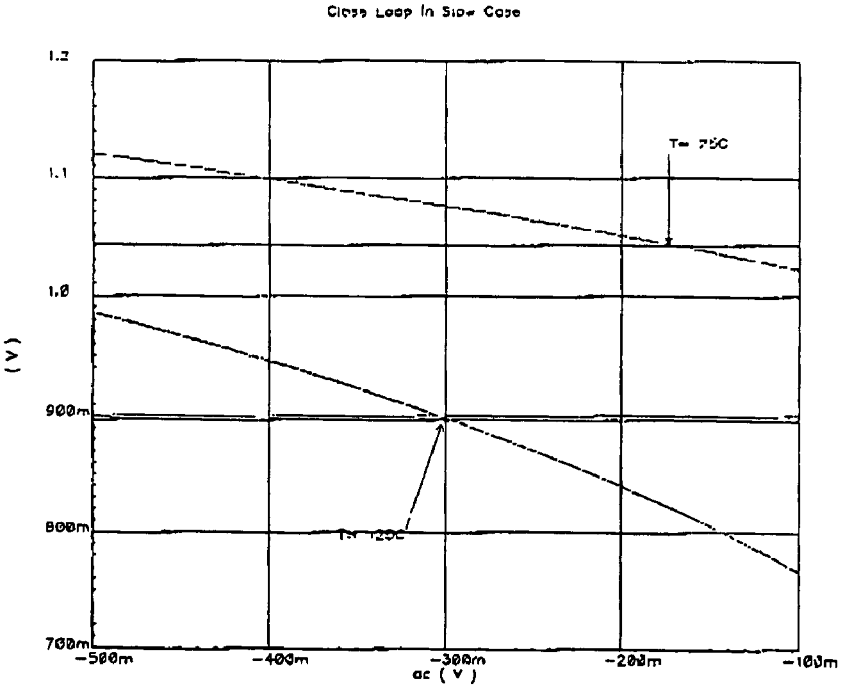
FIG. 15: a diagram of the output voltage evolution when back bias is applied to the p-well of the NMOS DUTs of the test circuit and the reference devices are tied to ground (case T=25° C. and 125° C., and "slow" transistors)

Simulations of the output voltage of the circuit under test show how the voltage is increased applying the well bias. However with the fixed value for the long channel devices the output of the reference circuit will be maintained constant, as depicted in FIG. 13, FIG. 14 and FIG. 15, when "fast", "nom." and "slow" status of the transistors are considered. The same behaviour has been checked for all the other possible combination of operating status between PMOS and NMOS transistors, that is "slow-fast" and "fast-slow".

The following example illustrates the detection of Vt and leakage control method based on the saturation regime of the DUTs and the reference devices.

Figure 16:
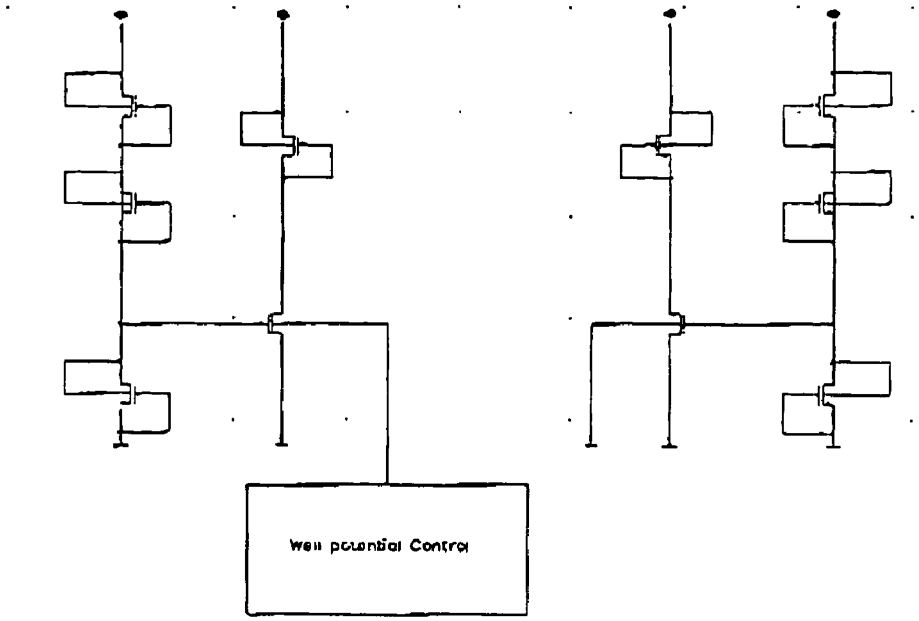
FIG. 16: a circuit configuration for the detection of $V_t$ variations in NMOS transistors based on detection of current in saturation.
Figure 17:
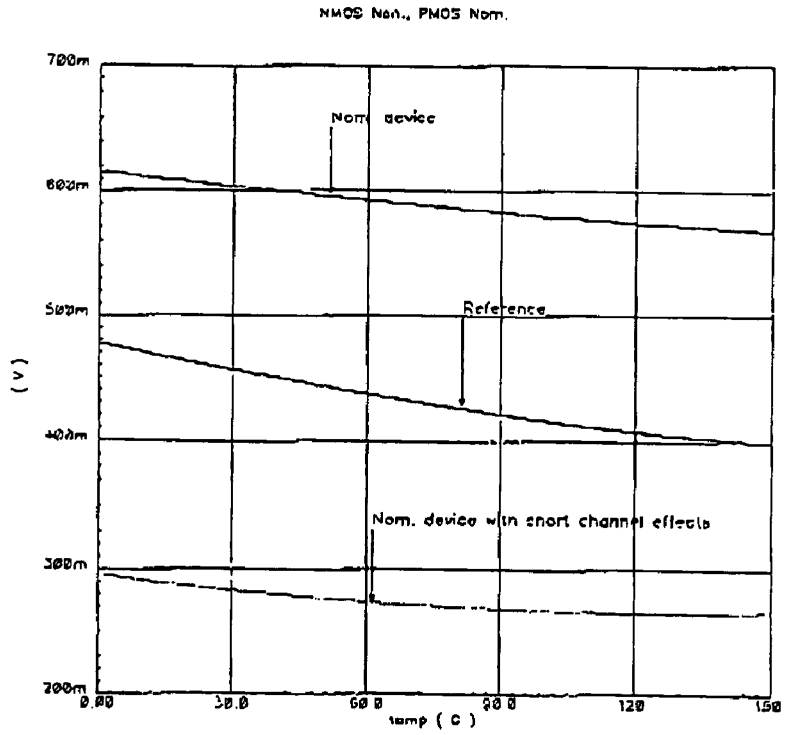
FIG. 17: a diagram of the detection of "nom." DUTs with short channel effects in front of "nom." devices without short channel effects when circuit configuration of FIG. 15 is implemented.
Figure 18:
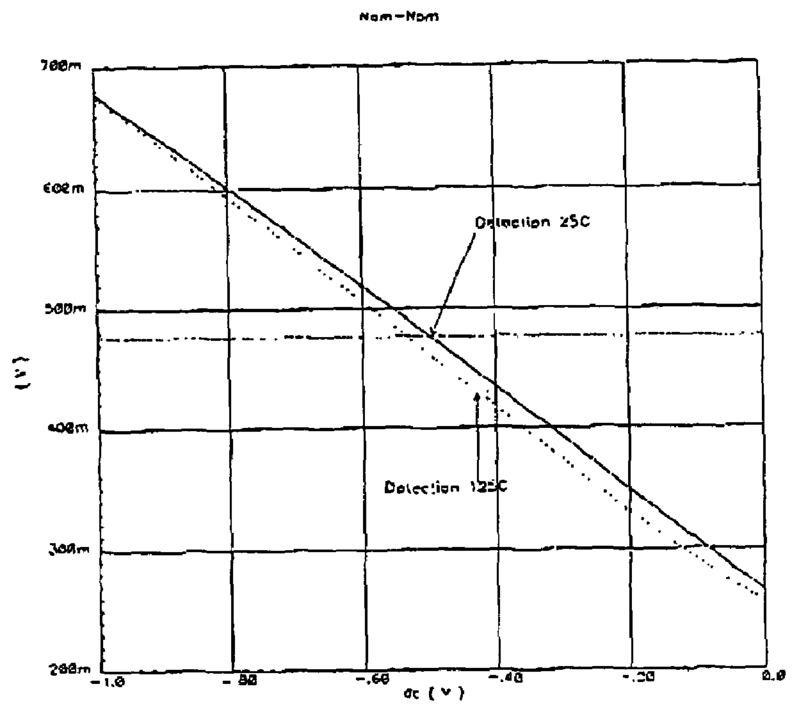
FIG. 18: a diagram of the output voltage evolution when back bias is applied to the pwell of the NMOS DUTs of the test circuit and the reference devices are tied to ground (case T=25° C. and 125° C., and "nom." transistors)

In this example the DUT and the reference devices are working in saturation. The saturation can be fixed by connecting the gate of the NMOS DUTs and the reference devices to VDD. If low current consumption is desired, it is also possible to fix the gates to a lower voltage value allowing also saturation operating conditions, see FIG. 16. The same implementation presented in FIGS. 4 and 5 will be also used in the case in which the gate of the DUTs and the reference transistors would be connected to voltage values allowing operation in saturation regime. The same operating principle pointed out above is also observed when the saturation current is detected. In nominal operating status, only the short channel effect is detected, and the detection is carried out for the operating temperature range as depicted in FIG. 17. The same behaviour has been also checked for the other status of operation ("fast", "slow", "slow-fast", "fast-slow"). As pointed out above the well potential would be adjusted up to the point in which the output voltage of the reference circuit and the circuit under test would be the same, see FIG. 18. The circuit configuration, depicted in FIG. 5, involving the comparator and the well potential bias circuit for the control of the leakage current, would be also implemented taking the outputs in the drains of the DUTs and the drains of the reference device as the inputs of the comparator.

Figure 19:
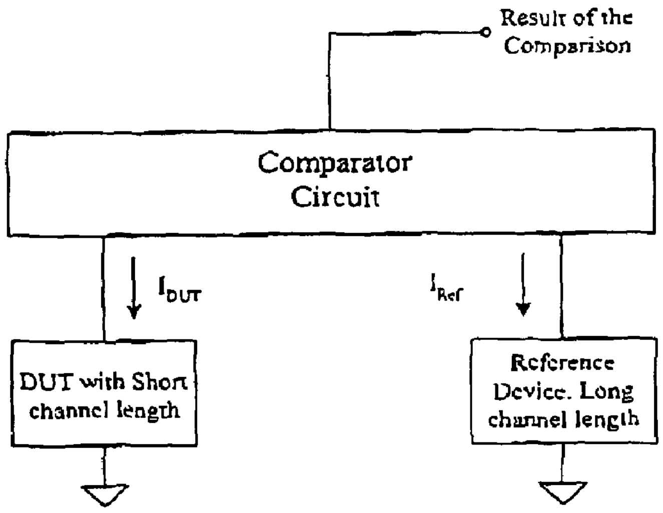
FIG. 19: a block diagram of the method according to the invention based on current comparison.
Figure 20:
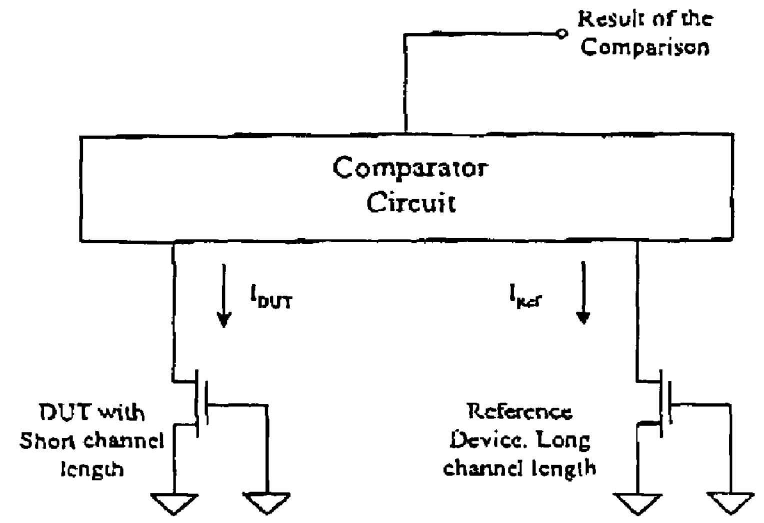
FIG. 20: an implementation of the inventive semiconductor device with transistors working in cut-off regime.
Figure 21:
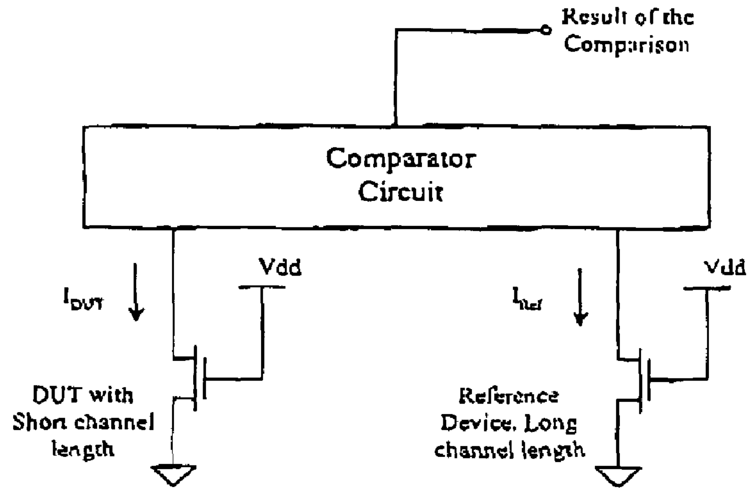
FIG. 21: an implementation of the inventive semiconductor device with transistors working in saturation regime.
Figure 22:
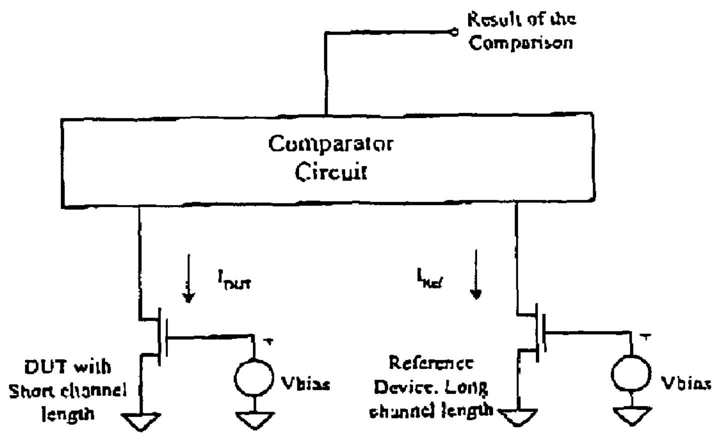
FIG. 22: a general implementation of the inventive semiconductor device in which a voltage source bias the gate of the DUT and the reference device
Figure 23:
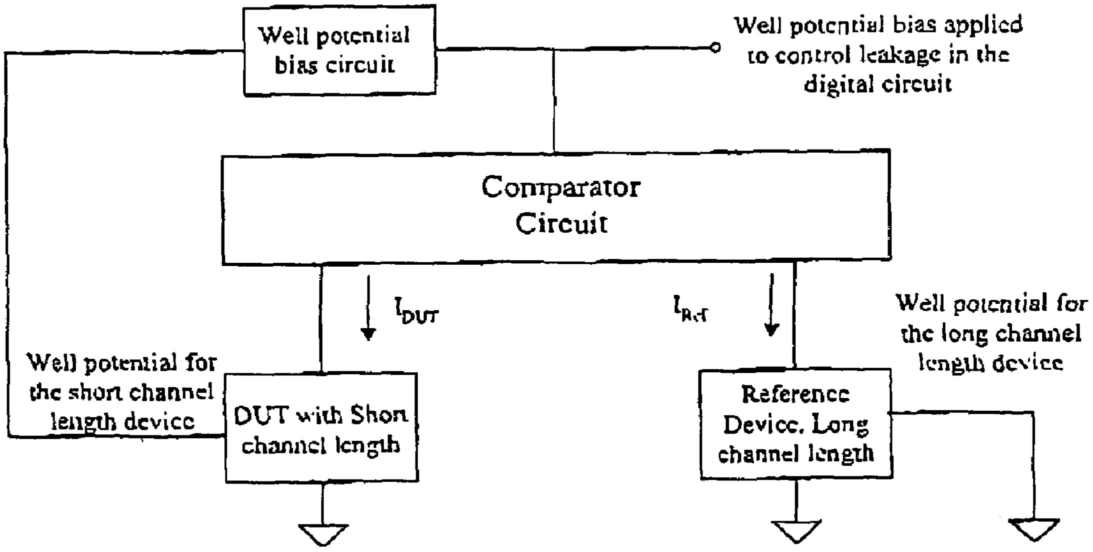
FIG. 23: a block diagram of the leakage control method according to the invention.

In the FIGS. 19 to 23 an embodiment of the inventive semiconductor device is illustrated whereby the threshold voltage variation is detected by current comparison. FIG. 19 shows a block diagram for current comparison when NMOS devices are considered. The configuration in which the devices work in cut-off regime is depicted in FIG. 20 whereas FIG. 21 shows a configuration in which the transistors are working in saturation regime. As can been seen from FIG. 22, in a more general configuration the gate of the transistors are tied to a desired value so that they operate in saturation regime whereby the current consumption is adjusted. In this scenario the control of the leakage current for a digital circuit would be establish as depicted in FIG. 23. In this block diagram the connection of the gate of the DUT and the reference devices can be any of the implemented in FIG. 20, FIG. 21, and FIG. 22.

What is claimed is:

1. A semiconductor device comprising a test circuit including a first transistor having a short channel length, the first transistor being in a first well, a reference circuit including a second transistor having a long channel length, the second transistor being in a second well, a comparator circuit for comparing an output of the test circuit with an output of the reference circuit, a bias circuit for providing a bias potential to the first well based on a difference between the output of the test circuit and the output of the reference circuit.

2. The semiconductor device according to claim 1, wherein the test circuit further comprises a plurality of transistors each having a short channel length.

3. The semiconductor device according to claim 1, wherein the reference circuit further comprises a plurality of transistors each having a long channel length.

4. The semiconductor device according to claim 1, wherein an output of the test circuit includes a drain current of the test circuit and an output of the reference circuit includes a drain current of the reference circuit.

5. The semiconductor device according to claim 2, wherein a gate of said first transistor and a gate of said second transistor are connected to ground.

6. The semiconductor device according to claim 2, wherein a gate of said first transistor and a gate of said second transistor are connected to a source of fixed voltage.

7. The semiconductor device according to claim 1, further comprising a first sensing element connected to a drain of the first transistor to sense a test circuit output voltage, a second sensing element connected to a drain of the second transistor to sense a reference circuit output voltage, wherein said comparator circuit compares the test circuit output voltage with the reference circuit output voltage, and said bias circuit provides a bias potential to the well of the test circuit based on the difference between the test circuit output voltage and the reference circuit output voltage.

8. The semiconductor device according to claim 7, wherein a gate of said first transistor and a gate of said second transistor are connected to ground.

9. The semiconductor device according to claim 7, wherein a gate of said first transistor and a gate of said second transistor are connected to a source of fixed voltage.

10. The semiconductor device according to claim 7, wherein the first sensing element is connected between the drain of the first transistor and a $V_{DD}$ voltage, and the second sensing element is connected between the drain of the second transistor and the $V_{DD}$ voltage.

11. The semiconductor device according to claim 7, wherein the first sensing element is connected between the drain of the first transistor and a $V_{SS}$ voltage, and the second sensing element is connected between the drain of the second transistor and the $V_{SS}$ voltage.

12. The semiconductor device according to claim 1, wherein the bias circuit is configured to provide a bias potential to the first well such that the output of the test circuit is equal to the output of the reference circuit.

13. The semiconductor device according to claim 1, further comprising a digital circuit in a third well, wherein said bias circuit includes a voltage source for providing a fixed potential to the first well and the third well.

14. The semiconductor according to claim 1, wherein said bias circuit includes a charge pump.

15. The semiconductor device according to claim 1, wherein the comparator circuit includes an analog comparator.

16. The semiconductor device according to claim 1, wherein the comparator circuit includes a digital comparator.

17. A method for detecting and adjusting variations of the threshold voltage caused by short channel effects in a semiconductor device, the method comprising providing a test circuit including a first transistor having a short channel length, the first transistor being in a first well;

providing a reference circuit including a second transistor having a long channel length, the second transistor being in a second well;

comparing an output of the test circuit with an output of the reference circuit for providing a comparison result; and applying a bias potential to the first well based on the comparison result.

18. The method according to claim 17, further comprising connecting a first sensing element to a drain of the first transistor, providing a test circuit output voltage according to the drain current of the first transistor, connecting a second sensing element to a drain of the second transistor, providing a reference circuit output voltage according to the drain current of the second transistor, providing a bias potential to the well of the test circuit based on the difference between the test circuit output voltage and the reference circuit output voltage.

* * * * *